(12) United States Patent
Holland

(10) Patent No.: US 10,269,971 B2
(45) Date of Patent: Apr. 23, 2019

(54) SEMICONDUCTOR DEVICES AND FINFETS

(71) Applicant: Taiwan Semiconductor Manufacturing Company, Ltd., Hsinchu (TW)

(72) Inventor: Martin Christopher Holland, Bertem (GB)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 15/845,875

(22) Filed: Dec. 18, 2017

(65) Prior Publication Data

US 2018/0122946 A1 May 3, 2018

Related U.S. Application Data

(63) Continuation of application No. 15/012,584, filed on Feb. 1, 2016, now Pat. No. 9,847,424, which is a
(Continued)

(51) Int. Cl.
*H01L 21/00* (2006.01)
*H01L 29/78* (2006.01)
*H01L 21/76* (2006.01)
*H01L 21/02* (2006.01)
*H01L 27/12* (2006.01)
(Continued)

(52) U.S. Cl.
CPC ...... *H01L 29/7851* (2013.01); *H01L 21/0243* (2013.01); *H01L 21/02043* (2013.01); *H01L 21/0262* (2013.01); *H01L 21/02063* (2013.01); *H01L 21/02378* (2013.01); *H01L 21/02381* (2013.01); *H01L 21/02538* (2013.01); *H01L 21/311* (2013.01); *H01L 21/76* (2013.01); *H01L 21/76224* (2013.01); *H01L 27/1211* (2013.01); *H01L 29/045* (2013.01); *H01L 29/0649* (2013.01); *H01L 29/1054* (2013.01); *H01L 29/20* (2013.01); *H01L 29/205* (2013.01); *H01L 29/267* (2013.01); *H01L 29/66462* (2013.01); *H01L 29/66795* (2013.01); *H01L 29/775* (2013.01); *H01L 29/7781* (2013.01); *H01L 21/02639* (2013.01)

(58) Field of Classification Search
CPC .......... H01L 21/0262; H01L 21/02538; H01L 21/311
USPC ........................................... 438/22
See application file for complete search history.

(56) References Cited

U.S. PATENT DOCUMENTS 6,108,360 A 8/2000 Razeghi
9,196,730 B1 11/2015 Yu et al.
(Continued)

OTHER PUBLICATIONS

Heyns, M. et al., "Advancing CMOS beyond the Si roadmap with Ge and III/V devices," IEEE, Electron Devices Meeting (IEDM), Dec. 5-7, 2011, pp. 13.11-13.1.4.
(Continued)

*Primary Examiner* — Long K Tran
(74) *Attorney, Agent, or Firm* — Slater Matsil, LLP

(57) ABSTRACT

Semiconductor devices and fin field effect transistors (Fin-FETs) are disclosed. In some embodiments, a representative semiconductor device includes a group III material over a substrate, the group III material comprising a thickness of about 2 monolayers or less, and a group III-V material over the group III material.

20 Claims, 7 Drawing Sheets

Related U.S. Application Data continuation of application No. 14/202,928, filed on Mar. 10, 2014, now Pat. No. 9,293,542.

(51) Int. Cl.

| | |
|---|---|
| *H01L 29/04* | (2006.01) |
| *H01L 21/311* | (2006.01) |
| *H01L 29/06* | (2006.01) |
| *H01L 29/267* | (2006.01) |
| *H01L 29/66* | (2006.01) |
| *H01L 21/762* | (2006.01) |
| *H01L 29/775* | (2006.01) |
| *H01L 29/778* | (2006.01) |
| *H01L 29/205* | (2006.01) |
| *H01L 29/10* | (2006.01) |
| *H01L 29/20* | (2006.01) |

(56) References Cited

U.S. PATENT DOCUMENTS

| | | |
|---|---|---|
| 2003/0017626 A1 | 1/2003 | Hilt et al. |
| 2004/0048409 A1 | 3/2004 | Biwa et al. |
| 2004/0235274 A1 | 11/2004 | Kurita et al. |
| 2006/0011972 A1 | 1/2006 | Graham et al. |
| 2006/0272572 A1 | 12/2006 | Uematsu et al. |
| 2010/0176459 A1 | 7/2010 | Wernersson et al. |
| 2010/0261340 A1 | 10/2010 | Nijhawan et al. |
| 2010/0301390 A1 | 12/2010 | Ko et al. |
| 2011/0233512 A1 | 9/2011 | Yang et al. |
| 2011/0253981 A1 | 10/2011 | Rooyackers et al. |
| 2011/0266595 A1 | 11/2011 | Hata |
| 2013/0130481 A1 | 5/2013 | Chua et al. |
| 2014/0374796 A1 | 12/2014 | Adam et al. |
| 2015/0008483 A1* | 1/2015 | Ching ............... H01L 29/7856 257/190 |
| 2015/0249139 A1 | 9/2015 | Cheng et al. |
| 2015/0279696 A1 | 10/2015 | Cohen et al. |
| 2015/0380533 A1 | 12/2015 | Sandow et al. |
| 2016/0099312 A1 | 4/2016 | Holland et al. |

OTHER PUBLICATIONS

Kawabe, Mitsuo et al., "Self-Annihilation of Antiphase Boundary in GaAs on Si(100) Grown by Molecular Beam Epitaxy," Japanese Journal of Applied Physics, vol. 26, No. 6, Jun. 1987, pp. L944-L946.

Kitahara, Kuninori et al,. "Observation of Atomic Structure by Scanning Tunneling Microscopy of Vicinal Si(100) Surface Annealed in Hydrogen Gas," Japanese Journal of Applied Physics, vol. 33, Part 2, No. 11B, Nov. 15, 1994, pp. L1571-L1573.

Kotlyar, V.G., et al., "Magic Nanoclusters of Group III Metals on Si(100) Surface," e-J. Surf. Sci. Nanotech, vol. 1 (2003), pp. 33-40.

Matthews, J.W. et al., "Defects in Epitaxial Multilayers," Journal of Crystal Growth, Mar. 27, 1974, North-Holland Publishsing Co., pp. 118-125.

Radosavljevic, M et al., "Non-Planar, Multi-Gate InGaAs Quantum Well Field Effect Transistors with High-K Gate Dielectric and Ultra-Scaled Gate-to-Drain/Gate-to-Source Separation in Low Power Logic Applications," IEEE, Electron Devices Meeting (IEDM), Dec. 6-8, 2010, pp. 6.1.1-6.1.4.

Radosavljevic, M. et al., "Electrostatics Improvement in 3-D Trigate Over Ultra-Thin Body Planar InGaAs Quantum Well Field Effect Transistors with High-K Gate Dielectric and Scaled Gate-to-Drain/Gate-to-Source Separation," IEEE, Electron Devices Meeting (IEDM), Dec. 5-7, 2011, pp. 33.1.1-33.1.4.

Tomioka, K., et al., "Growth of Highly Uniform InAs Nanowire Arrays by Selective-Area MOVPE," Journal of Crystal Growth 298 (2007) pp. 644-647.

Tomioka, K., et al., "Control of InAs Nanowire Growth Directions on Si," Nano Letters 2008, vol. 8, No. 10, pp. 3475-3480.

Van Dal, M.J.H. et al., "Demonstration of scaled Ge p-channel FinFETs integrated on Si," IEEE, Electron Devices Meeting (IEDM), Dec. 10-13, 2012, pp. 23.5.1-23.5.4.

Varrio, J., et al., "Model of Growth of Single-Domain GaAs Layers on Double-Domain Si Substrates by Molecular Beam Epitaxy," Appl. Phys. Lett., vol. 55, Issue 19, 1989, pp. 1987-1989.

\* cited by examiner

SEMICONDUCTOR DEVICES AND FINFETS

PRIORITY CLAIM AND CROSS-REFERENCE

This application is a continuation of U.S. patent application Ser. No. 15/012,584 filed on Feb. 1, 2016, entitled "Semiconductor Devices and FinFETS," which application is a continuation of U.S. patent application Ser. No. 14/202,928 filed on Mar. 10, 2014, entitled "Methods of Forming Semiconductor Devices and FinFETs," now U.S. Pat. No. 9,293,542 issued on Mar. 22, 2016, which is related to U.S. patent application Ser. No. 13/895,134, filed on May 15, 2013, entitled "Methods for Forming Semiconductor Materials in STI Trenches," which applications are hereby incorporated herein by reference.

BACKGROUND

Semiconductor devices are used in a variety of electronic applications, such as personal computers, mobile phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. The semiconductor industry continues to improve the integration density of various electronic components (e.g., transistors, diodes, resistors, capacitors, etc.) by continual reductions in minimum feature size, which allow more components to be integrated into a given area.

Multiple gate field-effect transistors (MuGFETs) are a recent development in semiconductor technology which typically are metal oxide semiconductor FETs (MOSFETs) that incorporate more than one gate into a single device. One type of MuGFET is referred to as a fin-FET (FinFET), which is a transistor structure with a fin-like semiconductor channel that is raised vertically out of the silicon surface of an integrated circuit.

Compound semiconductor materials of group III and group V elements (known as III-V compound semiconductors) are good candidates for forming transistors due to their high electron mobility. Therefore, transistors formed from III-V compound semiconductors have been explored.

BRIEF DESCRIPTION OF THE DRAWINGS

Aspects of the present disclosure are best understood from the following detailed description when read with the accompanying figures. It is noted that, in accordance with standard practice in the industry, various features are not drawn to scale. Accordingly, dimensions of the various features may be arbitrarily increased or reduced for clarity of discussion.

DETAILED DESCRIPTION

Figure 1:
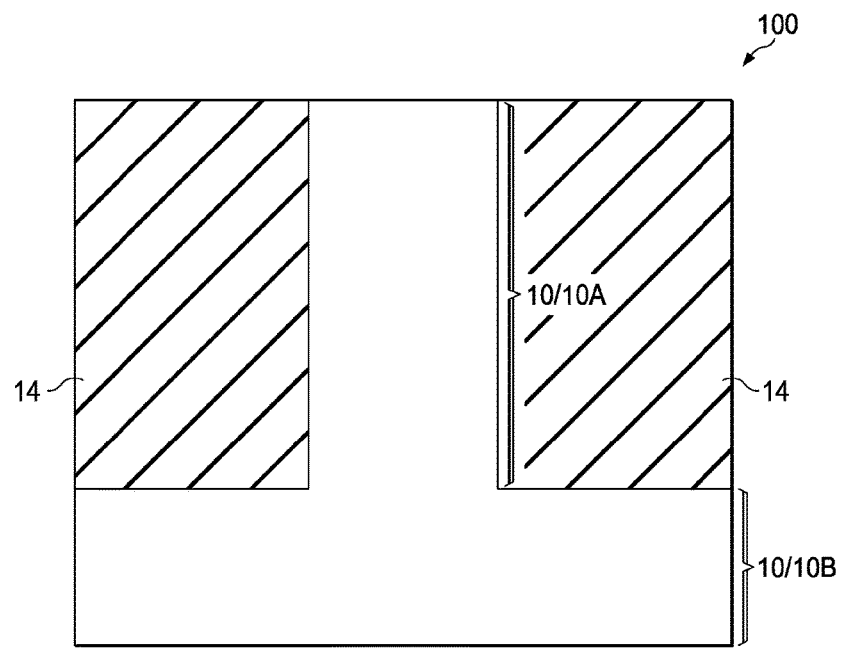
FIGS. 1 through 6 illustrate cross-sectional views of a method of forming a fin field effect transistor (FinFET) at various stages of manufacturing, in accordance with representative embodiments.

The following disclosure provides various representative embodiments, or examples, for implementing different features of the provided subject matter. Specific examples of components and arrangements are described below to simplify the present disclosure. These are, of course, merely examples and are not intended to be limiting. For example, the formation of a first feature "over" or "on" a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. Such repetition is for the purpose of simplicity and clarity, and does not in itself dictate a relationship between the various embodiments and/or configurations discussed herein.

Furthermore, spatially relative terms, such as "beneath," "below," "lower," "above," "upper" and the like, may be used herein for ease of description to describe one element or feature's relationship to another element(s) or feature(s) as illustrated in the figures. Spatially relative terms are intended to encompass different orientations of the device in use or operation in addition to the orientation representatively illustrated in the figures. The apparatus may be otherwise oriented or spatially transformed (e.g., rotated 90 degrees) and the spatially relative descriptors used herein may likewise be regarded as being so oriented or spatially transformed.

Some embodiments of the present disclosure provide methods of forming semiconductor devices and FinFETs, and structures thereof. In some embodiments, a seed layer is formed by first, forming a thin nucleation layer comprising a group III material over a substrate, and second, growing a group III-V layer from the group III material. A channel region of a transistor is then grown from the seed layer.

FIGS. 1 through 6 illustrate cross-sectional views of a representative method of forming a fin field effect transistor (FinFET) at various stages of manufacture in accordance with some embodiments of the present disclosure. Referring first to FIG. 1, a semiconductor device 100 is shown. To manufacture the semiconductor device 100, a substrate 10 is initially provided. The substrate 10 is part of a semiconductor wafer in some embodiments; e.g., a plurality of semiconductor devices 100 may be fabricated on a semiconductor wafer, with the wafer later singulated along scribe lines. Only one FinFET is shown in each of the drawings; however, a semiconductor device 100 may include dozens, hundreds, or thousands of FinFETs formed across a surface thereon, in some embodiments, for example.

The substrate 10 may include a semiconductor substrate comprising silicon (Si) or other semiconductor materials and may, or may not be, covered by an insulating layer, for example. The substrate 10 may include active components or circuits (not shown, for clarity of description). The substrate 10 may comprise silicon oxide over single-crystal silicon, for example. The substrate 10 may include conductive layers or semiconductor elements, e.g., transistors, diodes, etc., formed therein. The substrate 10 may comprise a single-crystalline Si or germanium (Ge) substrate in some embodiments. In some embodiments, the substrate 10 comprise Si oriented in a <0,0,1> crystalline orientation, as an example. Compound semiconductors such as GaAs, InP, SiGe, or SiC, as examples, may be used in place of Si or Ge. The substrate 10 may comprise a bulk substrate or a semiconductor-on-insulator (SOI) substrate, for example. Alternatively or conjunctively, the substrate 10 may comprise other materials and/or crystalline orientations.

A plurality of isolation regions, such as shallow trench isolation (STI) regions 14, are formed in the substrate 10. The isolation regions may comprise other types of isolation structures, such as field oxide regions, for example. The substrate 10 thus includes region 10A disposed between two of STI regions 14, and region 10B disposed under or beneath STI regions 14. The formation process of STI regions 14 may include etching substrate 10 to form recesses (which are occupied by STI regions 14 in FIG. 1), filling the recesses with a dielectric material(s) such as silicon oxide, silicon nitride, other insulating materials, or combinations or multiple layers thereof, and performing a planarization process to remove excess dielectric material from the top surface of substrate 10. The remaining portions of the dielectric material(s) residing in the recesses form STI regions 14.

Figure 2:
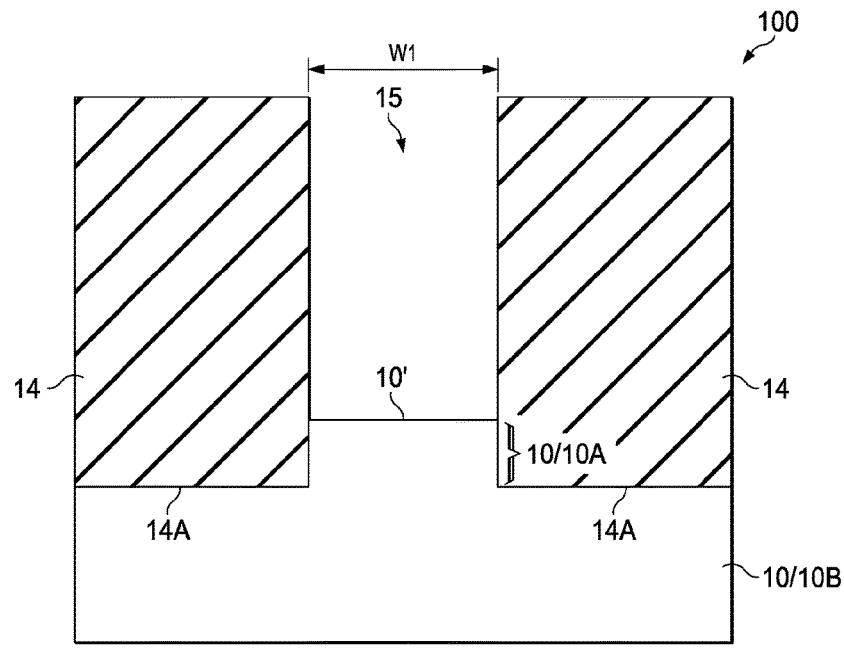

Next, as representatively illustrated in FIG. 2, a portion of substrate 10 between two STI regions 14 is recessed. For example, a top portion of region 10A of substrate 10 is removed, with region 10A disposed between opposite sidewalls of two STI regions 14. The top portion of region 10A is removed using an etch process to form a trench 15. In some embodiments, a top surface 10' of the substrate 10, which top surface 10' is exposed to the trench 15, is substantially level with bottom surfaces 14A of the STI regions 14. In alternative embodiments, the top surface 10' of region 10A of the substrate 10 is higher than or lower than the bottom surfaces 14A of STI regions 14 after the etch process used to form trench 15. The etch process may be performed using a dry etch, with the etching gas being selected from $CF_4$, $Cl_2$, $NF_3$, $SF_6$, and/or combinations thereof. In alternative embodiments, the etch process may be performed using wet etching, for example, using tetramethyl ammonium hydroxide (TMAH), a potassium hydroxide (KOH) solution, and/or the like, as an etchant. In the resulting structure, the trench 15 may have a width W1 that comprises about 150 nm or less, for example. Alternatively, the width W1 may comprise other values (larger or smaller). In some embodiments, the width W1 of the trench 15 may be between about 10 nm and about 100 nm. It will be appreciated, however, that the values recited throughout the description are merely examples, and may be changed to different values.

In some embodiments, after region 10A of substrate 10 is recessed, the substrate 10 is annealed. In some embodiments, an annealing process is performed at a temperature lower than about 870 degrees C., for example. Advantageously, by using the annealing temperature below about 870 degrees C., the wafer of the semiconductor device 100 will not bow (with significant warpage) after annealing. The annealing temperature of substrate 10 may also be higher than about 400 degrees C., and lower than about 800 degrees C., or lower than about 750 degrees C. In some representative embodiments, the annealing temperature may be between about 700 degrees C. and about 725 degrees C. The annealing process may be performed for a period of time between about 1 minute and about 10 minutes, although a longer or a shorter time period may be used. Alternatively, the substrate 10 may be annealed at other temperatures and for other durations of time.

In some embodiments, substrate 10 is annealed in the presence of hydrogen chloride (HCl) and hydrogen ($H_2$). For example, the annealing process may be performed in a process chamber (not shown, for clarity of description and illustration), with a process gas comprising HCl and $H_2$ being introduced into the chamber during the annealing process. The chamber comprises a metal oxide chemical vapor deposition (MOCVD) chamber in accordance with some embodiments, for example. Other types of chambers may also be used. During the annealing process, the flow rate of $H_2$ may be higher than the flow rate of HCl. For example, the flow rate of $H_2$ may be between about 500 standard cubic centimeters per second (sccm) and about 50,000 sccm. The flow rate of HCl may be between about 5 sccm and about 200 sccm. Alternatively, the $H_2$ and HCl flow rates may comprise other values. Annealing silicon in $H_2$ may cause the migration of silicon atoms at the top surface 10' of silicon region 10A to form double steps, as described in related patent application Ser. No. 13/895,134, filed on May 15, 2013, entitled "Methods for Forming Semiconductor Materials in STI Trenches". In addition, the introduction of HCl during the annealing process further promotes the migration of silicon atoms, so that the formation of double steps may be achieved at the lower temperatures of the anneal process, rather than temperatures higher than 870 degrees C. Accordingly, as a result of annealing, top surface 10' of region 10A of the substrate 10 is converted from a single-step surface to a double-step surface, and hence the amount of anti-phase domain defects in the subsequent epitaxial formed layers may be substantially eliminated, or at least reduced, in accordance with representative embodiments. In other embodiments, the substrate 10 may not be annealed in the presence of HCl and $H_2$.

The anneal process prepares surface 10' of region 10A of substrate 10. After the anneal process, the temperature of substrate 10 is lowered to a temperature of about 300 degrees C. to about 400 degrees C., in some embodiments.

Figure 3:
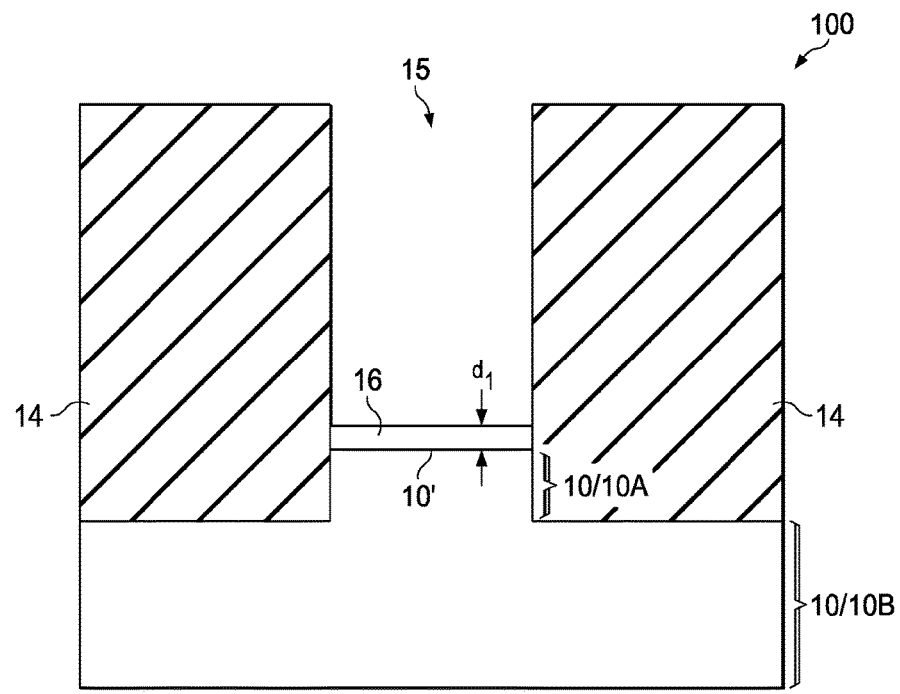

Referring next to FIG. 3, a group III material 16 is formed over region 10A of the substrate 10. The group III material 16 is formed in the recessed portion of the substrate 10 between two STI regions 14, e.g., within trench 15. The group III material 16 may comprise Ga, In, or Al, for example. The group III material 16 may have a thickness comprising dimension $d_1$ of about 2 monolayers or less in accordance with some embodiments. Dimension $d_1$ comprises about 0.5 monolayers to about 2 monolayers in some embodiments. In other embodiments, dimension $d_1$ comprises about 0.1 monolayers to about 1.5 monolayers. In some embodiments, dimension $d_1$ comprises about one monolayer, as another example. The group III material 16 comprises about 2 monolayers or less of the group III material 16 atoms, for example. Alternatively, the group III material 16 may comprise other materials and/or dimensions.

The group III material 16 may be formed by introducing a group III precursor into the chamber that semiconductor device 100 is being processed in. The precursor may comprise a material such as trimethyl indium (TMIn), triethyl gallium (TEGa), trimethyl gallium (TMGa), trimethyl aluminum (TMAl), tritertiarybutylaluminum (TTBAl), and/or combinations thereof, as examples. The precursor may be introduced at a flow rate of from about 10 sccm to about 150 sccm, for example. The group III precursor may be introduced for a time period of about 1 second to about 20 seconds, for example. Alternatively, the group III material 16 may be formed using other group III precursors, flow rates, and/or time periods of introduction.

In some embodiments, introducing the group III precursor comprises exposing surface 10' of substrate 10 to a group III flux, for example. In some embodiments, introducing the group III precursor results in a MOCVD formation of the group III material 16, for example.

The group III material 16 comprises a nucleation layer that improves growth conditions for subsequent formation processes for a group III/V material 18 (see FIG. 4), which advantageously allows the group III/V material 18 to be grown with a lower defect density. For example, the thin layer of the group III material 16 reduces a V/III ratio (e.g., of group V and group III precursor materials) required to form the group III/V material 18. The group III material 16 promotes nucleation of the group III/V material 18 on substrate 10 surface 10'. The group III material 16 comprises a pre-layer for the formation of the group III/V material 18 in some embodiments, for example.

Figure 4:
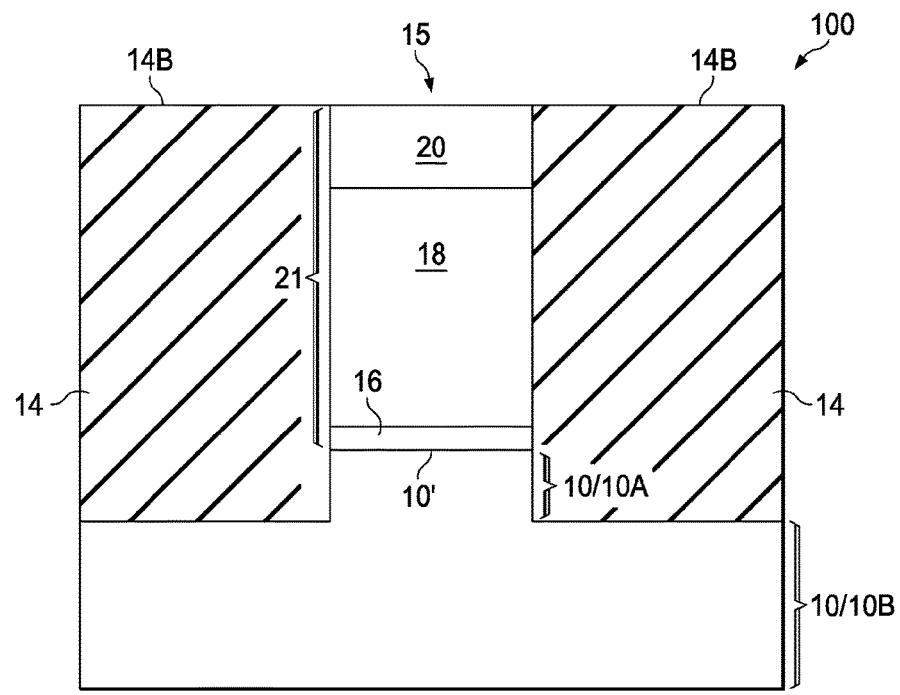

Referring next to FIG. 4, a group III-V material 18 is formed over the group III material 16. The group III-V material 18 comprises a group III material combined with a group V material. In some embodiments, the group III-V material 18 includes the same group III material of the group III material 16, for example. In other embodiments, the group III-V material 18 includes a different group III material than a group III material of the group III material 16. The group III-V material 18 may comprise InAs, GaAs, AlAs, InP, GaP, AlP, InSb, GaSb, AlSb, and/or other group III-V compound materials, as examples. The group III-V material 18 may comprise any group III-V compound material in some embodiments, for example. The group III-V material 18 comprises a thickness of about 2 nm to about 100 nm, for example. Alternatively, the group III-V material 18 may comprise other materials and/or dimensions.

The group III-V material 18 may be formed over the group III material 16 within trench 15 by continuing to introduce the group III precursor into the chamber, and introducing a group V precursor into the same chamber, in some embodiments. In other embodiments, the group III precursor may be discontinued for a predetermined time period, and then the group III precursor and the group V precursor are substantially simultaneously introduced into the chamber. The group V precursor may be introduced into the same chamber in which the group III material 16 was formed on the semiconductor device 100, for example. The same precursor used to form the group III material 16 may be used to form the group III-V material 18, or a different precursor than that used to form the group III material 16 may be used to form the group III-V material 18, for example.

The group V material used for growth of the group III-V material 18 may comprise As, P, Sb, and/or other materials, as examples. The group V precursor may comprise a material such as tributyl arsenic (TBAs), arsine ($AsH_3$), phosphine ($PH_3$), tributyl phosphorus (TBP), trimethyl antimony (TMSb), triethyl antimony (TESb), and/or a combination thereof, as examples. The group V precursor may be introduced at a flow rate of about 20 sccm to about 500 sccm, for example. The group V precursor may be introduced for a time period of about 5 seconds to about 1,200 seconds, for example. Alternatively, the group III-V material 18 may be formed using other group V precursors, flow rates, and time periods of introduction. In some embodiments, introduction of the group III precursor and the group V precursor results in epitaxial growth of the group III-V material 18 from the group III material 16, for example.

In some embodiments, the group III-V material 18 may include defects caught by aspect ratio trapping (ART).

Advantageously, the group III-V material 18 generally comprises a lower defect density due to the presence of the underlying group III material 16 nucleation layer.

The group III-V material 18 may function as a seed layer for epitaxial growth of a subsequently formed material layer. In some embodiments, both the group III material 16 and the group III-V material 18 function as a seed layer for epitaxial growth of a subsequently formed material layer, for example. In some embodiments, the group III material 16 and/or the group III-V material 18 function as a seed layer for epitaxial growth of the subsequently formed channel material. The channel material comprises a channel region of a transistor, for example.

For example, FIG. 4 illustrates a channel material 20 disposed over the group III-V material 18 within trench 15. In some embodiments, precursors are introduced into the chamber so that the channel material 20 may be epitaxially grown from the group III-V material 18, for example. The channel material 20 may comprise about 2 nm to about 500 nm of a conductive or semiconductive material in some embodiments, such as any III/V binary, ternary, or quaternary semiconductor material that includes In, Ga, and/or Al as the group III material and As, P, and/or Sb as the group V material, as examples. Some precursors used to epitaxially grow the channel material 20 include TMIn, TEGa, TMGa, TMAl, TTBAl, TBAs, $AsH_3$, $PH_3$, TBP, TMSb, TESb, and/or combinations thereof, as examples. Alternatively, the channel material 20 may comprise other dimensions and/or materials, and may be formed using other precursors. The channel material 20 may be substantially defect-free in accordance with some embodiments, due to the improved seed layer comprising the group III material 16 and the group III-V material 18.

The group III material 16, the group III-V material 18, and the channel material 20 comprise semiconductor region 21 that is epitaxially grown within trench 15 disposed between STI regions 14 in some embodiments.

The epitaxial growth of channel material 20 may be continued until the top surface of semiconductor region 21 is higher than top surfaces 14B of STI regions 14 in some embodiments. A planarization may then be performed. The planarization may comprise a chemical mechanical polish (CMP) and/or other process(es). The planarization may be continued until substantially no portion of channel material 20 is left overlapping STI regions 14 (e.g., until the top surface of the channel material 20 is coplanar with top surface 14B of STI regions 14). In alternative embodiments, the epitaxy process may be stopped when the top surface of channel material 20 is substantially level with, or lower than, top surfaces 14B of STI regions 14. In such representative embodiments, the planarization step may be omitted, or may be performed.

Figure 5:
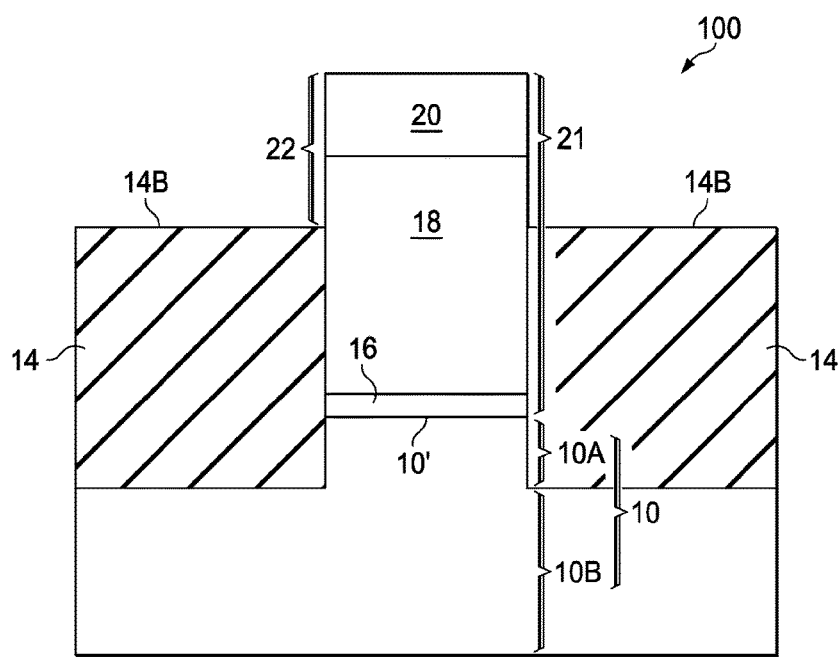

Referring next to FIG. 5, STI regions 14 are recessed, for example, using an etching process. A portion of semiconductor region 21 is thus higher than top surfaces 14B of STI regions 14. Channel material 20 and a portion of the group III-V material 18 may be higher than top surfaces 14B of STI regions 14, as representatively illustrated in FIG. 5, for example. This portion of semiconductor region 21 forms a semiconductor fin 22, which may be used to form a FinFET 24, as representatively illustrated in FIG. 6. In some embodiments, at least a portion of channel material 20 over top surfaces 14B of remaining portions of STI regions 14 forms a semiconductor fin 22, for example.

Figure 6:
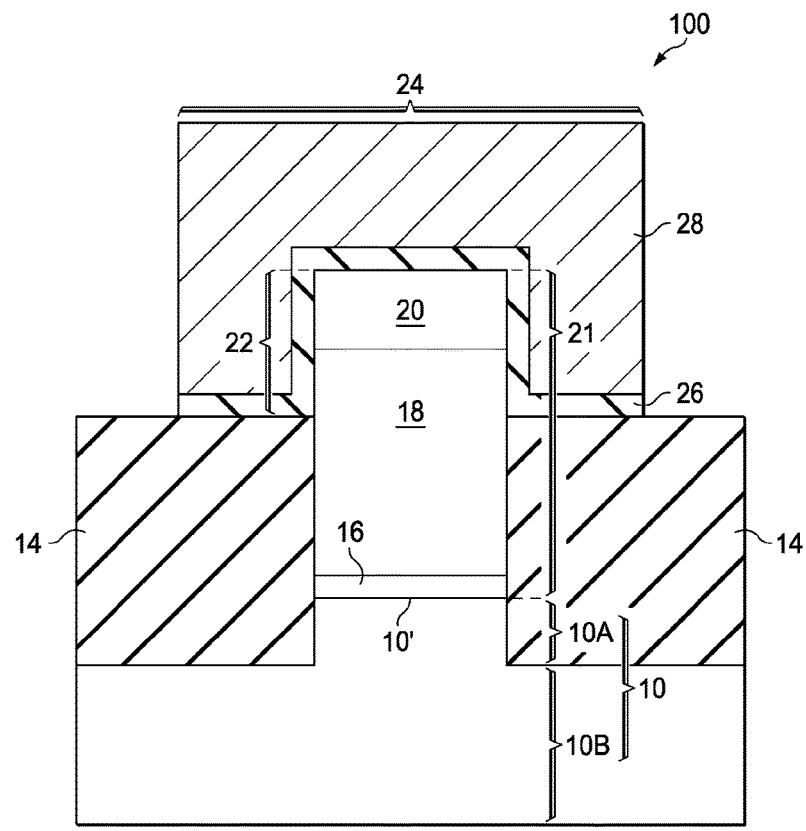

Referring to FIG. 6, a gate dielectric 26 and a gate electrode 28 are formed. The gate dielectric 26 is formed on sidewalls and a top surface of semiconductor fin 22. Gate dielectric 26 may be formed of a dielectric material such as silicon oxide, silicon nitride, an oxynitride, multi-layers thereof, and combinations thereof. Gate dielectric 26 may also comprise a high dielectric constant (high-k) dielectric material. Some representative high-k materials may include materials having k values greater than about 4.0, or greater than about 7.0. Gate electrode 28 is formed over gate dielectric 26. Gate electrode 28 may be formed of doped polysilicon, metals, metal nitrides, metal silicides, and/or the like. The bottom ends of gate dielectric 26 may contact the top surface of STI regions 14. Gate electrode 28 and gate dielectric 26 may be patterned, e.g., using a lithography process. After formation of gate dielectric 26 and gate electrode 28, source and drain regions (not shown in the illustrated plane) may be formed to advance fabrication of FinFET 24.

FinFET 24 advantageously provides improved device performance due to, e.g., the substantially defect-free channel material 20 formed using the seed layer comprising the group III material 16 and the group III-V material 18.

Referring again to FIG. 3, in some embodiments, substrate 10 may comprise a non-polar semiconductor material, with a polar semiconductor material formed over substrate 10. For example, substrate 10 may comprise a non-polar semiconductor material such as Si, Ge, and/or other materials. The polar semiconductor material may include a compound of a group III material and a group V material, for example. The polar semiconductor material may comprise a group III material 16 which comprises a first component of the polar semiconductor material. The first component may comprise a thickness of about 2 monolayers or less. The polar semiconductor material includes a first component and a second component of the polar semiconductor material disposed over the group III material 16. For example, the first component and the second component may comprise a group III-V material 18 in some embodiments. The first component may comprise a group III material, and the second component may comprise a group V material, in some embodiments. Alternatively, the first component and the second component may comprise other materials.

Figure 7:
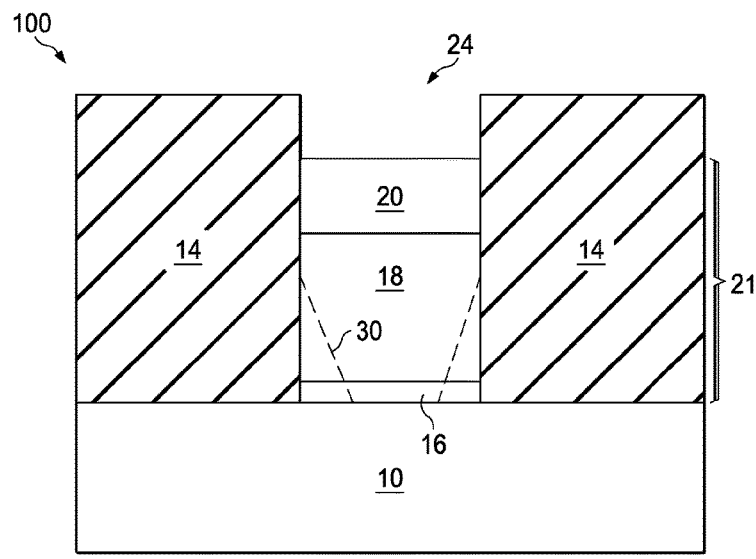
FIG. 7 is a cross-sectional view of a representative FinFET semiconductor device in accordance with some embodiments.
Figure 8:
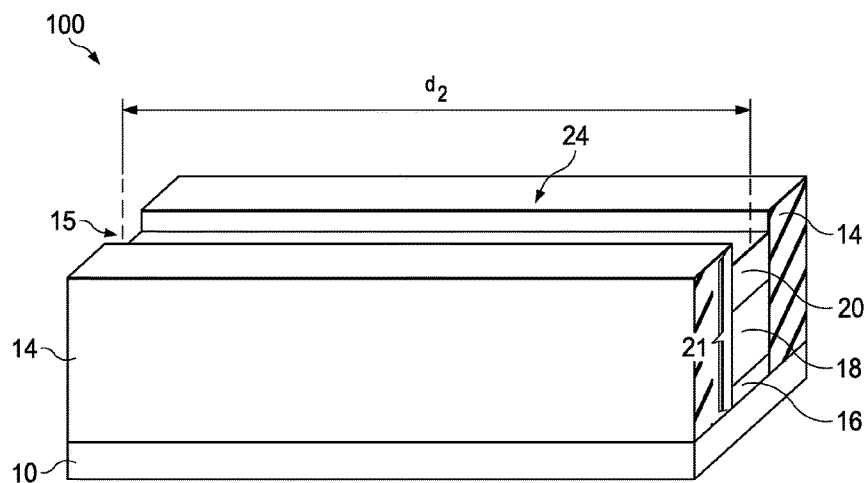
FIG. 8 is a perspective view of the semiconductor device shown in FIG. 7 in accordance with representative embodiments.

FIG. 7 is a cross-sectional view of a semiconductor device 100 including a FinFET 24 in accordance with some embodiments after the manufacturing process step shown in FIG. 4 (e.g., in embodiments where channel material 20 top surface is formed to a level below a top surface of STI regions 14). Region 30 illustrates an area within the semiconductor device 100 wherein some defects caught by ART anti-phase domain defects (APDs) are eliminated, or otherwise substantially reduced, in accordance with some embodiments, resulting in a substantially defect-free channel material 20. FIG. 8 is a perspective view of the semiconductor device 100 shown in FIG. 7 in accordance with some embodiments. The trench 15 comprises a length comprising dimension $d_2$ in some embodiments, wherein dimension $d_2$ comprises about 1 μm or less in some embodiments. Alternatively, dimension $d_2$ may comprise other values.

Figure 9:
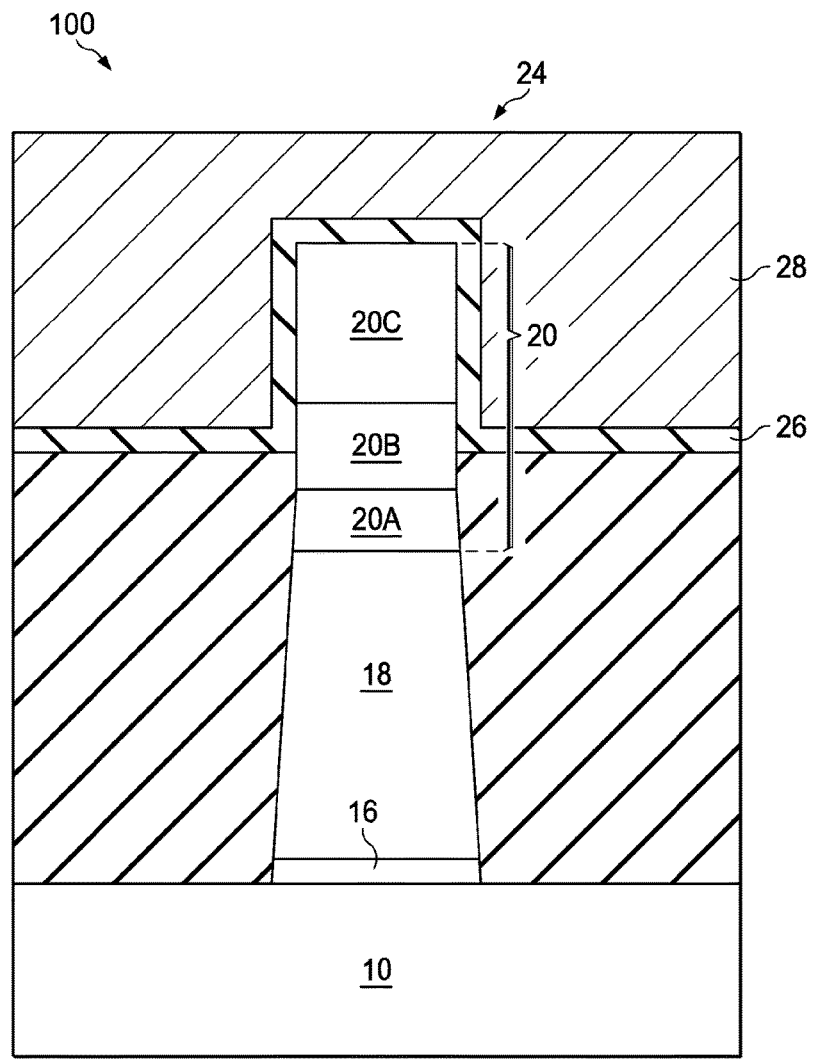
FIG. 9 is a cross-sectional view of a representative FinFET semiconductor device in accordance with some embodiments.

FIG. 9 is a cross-sectional view of a semiconductor device 100 including a FinFET 24 in accordance with some embodiments. Channel material 20 may include a plurality of material layers 20A, 20B, and 20C in accordance with some embodiments. Material layers 20A, 20B, and 20C may comprise different materials and may be adapted to achieve predetermined properties for channel material 20 of FinFET 24, for example.

Figure 10:
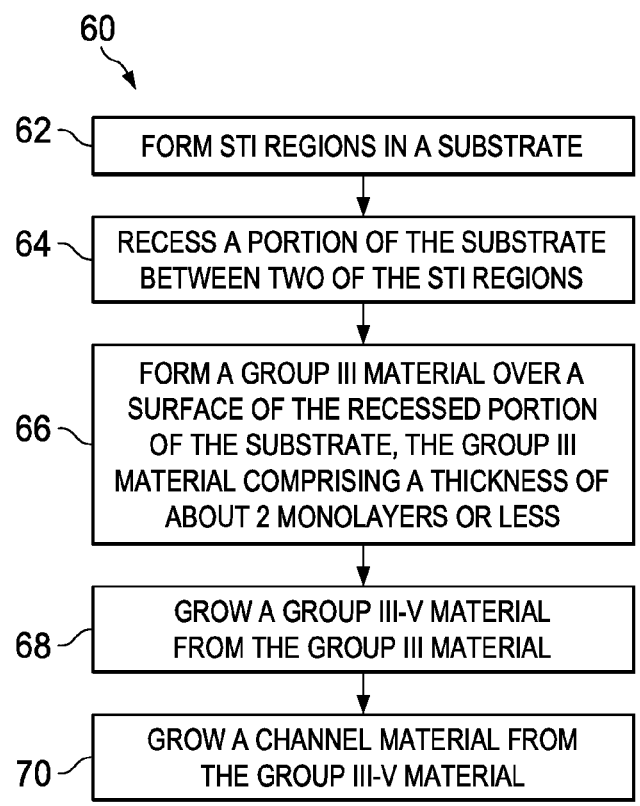
FIG. 10 is a flow chart of a method of manufacturing a semiconductor device in accordance with some embodiments.

FIG. 10 is a flow chart 60 of a representative method of manufacturing a FinFET 24 in accordance with some embodiments. In step 62, STI regions 14 (see also FIG. 1) are formed in substrate 10. In step 64, a portion of substrate 10 is recessed between two STI regions 14 (FIG. 2). In step 66, a group III material 16 is formed over a surface of the recessed portion of substrate 10, the group III material 16 comprising a thickness of about 2 monolayers or less (FIG. 3). In step 68, a group III-V material 18 is grown from the group III material 16 (FIG. 4). And in step 70, a channel material 20 is grown from the group III-V material 18.

Representative embodiments of the present disclosure include methods of forming semiconductor devices 100, and also include methods of forming FinFETs 24.

Advantages of some embodiments of the present disclosure include providing novel methods of forming seed layers used to form channel materials of transistors that result in improved device performance. Having about 2 monolayer or less thickness of group III material improves nucleation on the substrate for growth of subsequently formed group III/V material. The group III material promotes nucleation of the group III/V material on the substrate surface, for example. The group III/V material may either be substantially defect-free or have fewer defects, and/or has a lower defect density, due to inclusion of a thin group III material in the structure of semiconductor device 100.

The group III and group III/V materials may be formed using selective area growth (SEG) by MOCVD within STI regions in some embodiments. Using a group III material having a thickness of about 2 monolayers or less as a pre-layer advantageously promotes an ability to use much lower group V/group III precursor ratios when later forming or growing the group III/V material. Thus, the group III/V material can be nucleated on the substrate without requiring the use of high group V fluxes or precursors, which improves nucleation and also reduces defects. The group III material nucleation layer also substantially improves the range of growth conditions that may be used to form the group III/V material, allowing the group III/V material to be grown with a lower defect density.

FinFET channel materials grown from the group III/V material generally provide improved carrier mobility and device performance. Channel materials grown from the group III/V material generally have reduced defects or are substantially defect-free. Furthermore, the methods described herein may be readily implemented in semiconductor device and FinFET manufacturing process flows.

In some embodiments, a method of forming a semiconductor device includes forming a group III material over a substrate, the group III material comprising a thickness of about 2 monolayers or less. Representative methods include forming a group III-V material over the group III material.

In other embodiments, a method of forming a semiconductor device includes forming a polar semiconductor material over a substrate, the substrate comprising a non-polar semiconductor material. Forming the polar semiconductor material may comprise forming a first component of the polar semiconductor material over the substrate, the first component having a thickness of about 2 monolayers or less. Forming the polar semiconductor material may further comprise forming the first component of the polar semiconductor material and a second component of the polar semiconductor material over the first component.

In other embodiments, a method of forming a FinFET includes forming STI regions in a substrate, recessing a portion of the substrate between two of the STI regions, and forming a group III material over a surface of the recessed portion of the substrate. The group III material having a thickness of about 2 monolayers or less. The method includes growing a group III-V material from the group III material, and growing a channel material from the group III-V material.

In other embodiments, a fin field effect transistor (FinFET), includes: a first fin portion comprising a group III material, the first fin portion over a substrate, the first fin portion having a thickness of about 2 monolayers or less; a second fin portion comprising a group III-V material, the second fin portion over the first fin portion, a group III component of the group III-V material comprising a same material as the group III material of the first fin portion; and a channel over the second fin portion, the channel comprising the group III-V material. The FinFET may also have a channel material over the group III-V material. The FinFET may also be configured with shallow trench isolation (STI) regions in the substrate, and a recessed portion of the substrate between two STI regions, where the first fin portion is in the recessed portion of the substrate. The STI regions may have recessed portions, where a semiconductor fin comprises a portion of the channel material over top surfaces of remaining portions of the STI regions. The FinFET may further comprise a gate dielectric on sidewalls and a top surface of the semiconductor fin, and a gate electrode over the gate dielectric. The channel material may be epitaxially deposited. The group III-V material may comprise a seed layer for epitaxial growth of the channel material. The first fin portion may comprise a nucleation layer. The first fin portion and the second fin portion may have a width that is less than about 150 nm (e.g., from about 10 nm to about 100 nm).

In other representative embodiments, a semiconductor device may comprise: a first layer over a substrate, the substrate comprising a non-polar semiconductor material, wherein the first layer comprises a first component of a polar semiconductor material over the substrate, the first layer having a thickness of about 2 monolayers or less; and a second layer over and in physical contact with the first layer, the second layer comprising: the first component of the polar semiconductor material of the first layer; and a second component of the polar semiconductor material. The non-polar semiconductor material may comprise, e.g., Si or Ge. The first layer may comprise a polar semiconductor material that is at least one of a group III material or a group V material. The first layer may comprise a group III material, and the second layer comprises a group III-V material. The first component may be the group III material.

In yet another representative embodiment, FinFET may comprise: shallow trench isolation (STI) regions in a substrate; the substrate having a recessed portion between two STI regions; a first layer over a surface of the recessed portion of the substrate, the first layer comprising a group III material, the first layer having a thickness of about 2 monolayers or less; a second layer over and in physical contact with the first layer, the second layer comprising a III-V material, wherein a group III component of the III-V material is a same material as the group III material of the first layer; and a third layer over the second layer, wherein the third layer corresponds to a channel, the third layer comprising the III-V material. The FinFET may further include recessed portions of the STI regions, where a portion of the third layer disposed above top surfaces of remaining portions of the STI regions forms a semiconductor fin. The FinFET may further include a gate dielectric on sidewalls and a top surface of the semiconductor fin, and a gate electrode over the gate dielectric. The first layer may comprise a nucleation layer. The first layer may comprise Ga, In, or Al.

The foregoing outlines features of several embodiments so that those skilled in the art may better understand various aspects of the present disclosure. Those skilled in the art will appreciate that they may readily use the present disclosure as a basis for designing or modifying other processes and/or structures for carrying out substantially similar purposes and/or achieving substantially similar advantages of the embodiments introduced herein. Those skilled in the art will also realize that such substantially equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    recessing a substrate material between a first isolation region and a second isolation region to form an opening;
    annealing the substrate material after the recessing the substrate material;
    growing 2 monolayers or less of a group III material on the substrate material after the annealing the substrate material, wherein the group III material is free from Group V elements;
    nucleating a III-V material over and in physical contact with the group III material, the group III material being grown within the opening;
    growing a channel material from the III-V material and within the opening;
    planarizing the channel material with the first isolation region and the second isolation region; and
    recessing the first isolation region and the second isolation region to expose at least a portion of the III-V material.

2. The method of claim 1, wherein the opening has a width of between about 10 nm and about 100 nm.

3. The method of claim 1, wherein the recessing is performed using a wet etching process.

4. The method of claim 1, wherein the annealing is performed at a temperature of between about 400 degrees C. about 800 degrees C.

5. The method of claim 1, wherein the annealing is performed at a temperature of between about 700 degrees C. and about 725 degrees C.

6. The method of claim 1, wherein after the annealing the substrate material the substrate material has a double-step surface.

7. The method of claim 1, wherein the annealing the substrate material is performed in a presence of hydrogen chloride.

8. A method of manufacturing a semiconductor device, the method comprising:
    planarizing a semiconductor material with an isolation region;
    removing a portion of the semiconductor material after the planarizing the semiconductor material while leaving a remainder of the semiconductor material;
    annealing the remainder of the semiconductor material;
    introducing at least one precursor to the remainder of the semiconductor material after the annealing the remainder of the semiconductor material, wherein the introducing the at least one precursor forms no more than 2 monolayers of a group III material;
    using the group III material as a seed layer to grow a III-V material below a top surface of the isolation region;
    using the III-V material to grow a channel material;

planarizing the channel material with the isolation region; and exposing a sidewall of the channel material after the planarizing the channel material.

9. The method of claim 8, wherein the annealing the remainder of the semiconductor material comprises introducing a flow rate of hydrogen chloride and a flow rate of molecular hydrogen.

10. The method of claim 9, wherein the flow rate of molecular hydrogen is higher than the flow rate of hydrogen chloride.

11. The method of claim 10, wherein the flow rate of molecular hydrogen is between about 500 sccm and about 50,000 sccm.

12. The method of claim 11, wherein the flow rate of hydrogen chloride is between about 5 sccm and about 200 sccm.

13. The method of claim 8, wherein the introducing the at least one precursor comprises a group III flux.

14. The method of claim 8, wherein the III-V material and the group III material comprise a same group III element.

15. A method of manufacturing a semiconductor device, the method comprising:

annealing a first surface which comprises a semiconductor material and an isolation material, wherein the first surface has a step change in height with respect to a semiconductor substrate;

growing a group III material onto the semiconductor material;

growing a III-V material onto the group III material, wherein during the growing the III-V material the group III material has a thickness of less than two monolayers;

growing a channel material onto the III-V material;

reducing the channel material to be planar with the isolation material; and recessing the isolation material after the reducing the channel material.

16. The method of claim 15, wherein the growing the group III material comprises introducing a group III precursor gas.

17. The method of claim 16, wherein the growing the III-V material comprises:

continuing to introduce the group III precursor gas; and introducing a group V precursor gas.

18. The method of claim 16, wherein the growing the III-V material comprises:

discontinuing the introducing the group III precursor gas; and simultaneously introducing a group V precursor gas and the group III precursor gas after the discontinuing the introducing the group III precursor gas.

19. The method of claim 15, wherein the annealing the first surface is performed at least in part using hydrogen chloride.

20. The method of claim 19, wherein the annealing the first surface is performed at least in part using hydrogen.

* * * * *